United States Patent [19]
Buti et al.

[11] Patent Number: 5,736,891
[45] Date of Patent: Apr. 7, 1998

[54] DISCHARGE CIRCUIT IN A SEMICONDUCTOR MEMORY

[75] Inventors: Taqi Nasser Buti, Millbrook; Louis Lu-Chen Hsu, Fishkill; Jente B. Kuang; Somnuk Ratanaphanyarat, both of Poughkeepsie; Mary J. Saccamango, Poughquag, all of N.Y.; Hyun Jong Shin, Ridgefield, Conn.

[73] Assignee: International Business Machines Corporation, Armonk, N.Y.

[21] Appl. No.: 585,336

[22] Filed: Jan. 11, 1996

[51] Int. Cl.⁶ .................................................. H03K 17/687
[52] U.S. Cl. ........................... 327/434; 327/327; 327/437; 365/185.29; 365/185.31; 365/185.33; 365/218
[58] Field of Search .................................... 327/111, 112, 327/327, 333, 437, 434; 365/185.11, 185.12, 185.18, 185.24, 185.26, 185.29, 185.31, 185.3, 185.33, 218

[56] References Cited

U.S. PATENT DOCUMENTS

| | | | |
|---|---|---|---|
| 4,511,811 | 4/1985 | Gupta | 327/111 |
| 4,912,749 | 3/1990 | Maruyama et al. | 365/185.11 |
| 4,930,105 | 5/1990 | Matsumoto et al. | 365/185.18 |
| 5,033,023 | 7/1991 | Hsia et al. | 365/185.12 |
| 5,103,425 | 4/1992 | Kuo et al. | 365/185.23 |
| 5,265,059 | 11/1993 | Wells et al. | 365/185.25 |
| 5,282,170 | 1/1994 | Van Buskirk et al. | 365/185.33 |
| 5,309,012 | 5/1994 | Jex et al. | 365/185.33 |
| 5,335,200 | 8/1994 | Coffman et al. | 365/218 |
| 5,357,463 | 10/1994 | Kinney | 365/185.22 |
| 5,357,476 | 10/1994 | Kuo et al. | 365/185.12 |
| 5,463,587 | 10/1995 | Maruyama | 365/185.24 |

FOREIGN PATENT DOCUMENTS

| | | |
|---|---|---|
| 4-278298 | 10/1992 | Japan. |
| 5-343700 | 12/1993 | Japan. |
| 2201059 | 8/1988 | United Kingdom. |

Primary Examiner—Timothy P. Callahan
Assistant Examiner—Kenneth B. Wells
Attorney, Agent, or Firm—DeLio & Peterson, LLC; Peter W. Peterson; Susan M. Murray

[57] ABSTRACT

A discharge circuit for a semiconductor memory includes a first node, a second node for receiving a control signal having first and second states, and a circuit connected between the first node and ground potential and to the second node. The circuit couples the first node to ground potential when the control signal has the first state and substantially isolates the first node from ground potential when the control signal has the second state. The circuit includes a first subcircuit for defining a current path between the first node and ground potential. The first subcircuit includes a plurality of transistors connected in series, each of which having a gate, source and drain. The circuit further includes a second subcircuit for effecting predetermined gate-to-source, and drain-to-source voltages of the transistors of the first subcircuit when the control signal has the second state.

15 Claims, 11 Drawing Sheets

5,736,891

DISCHARGE CIRCUIT IN A SEMICONDUCTOR MEMORY

BACKGROUND OF THE INVENTION

1. Field of the Invention

The present invention pertains to the field of semiconductor memories and more particularly to discharge circuits for use with semiconductor memories.

2. Problem to be Solved

Computer memories typically can be divided into two main categories: volatile and nonvolatile. Volatile memories retain their data only so long as power is applied. Nonvolatile memories retain their data after power is removed.

One type of nonvolatile semiconductor memory is the flash electrically erasable programmable read-only memory ("flash EEPROM"). A flash EEPROM generally includes an array of floating gate, single transistor memory cells. The memory cells can be programmed by a user to store data in the form of digital bits (i.e., 0s and 1s), wherein an individual memory cell stores one bit of data. Once programmed, the flash EEPROM retains its data until erased. After erasure, the flash EEPROM can be reprogrammed with new data. The same flash EEPROM is typically capable of being cycled (i.e., erased and reprogrammed) thousands of times. As with an EPROM, the entire memory array of a flash EEPROM is bulk erased, but instead of using ultraviolet (UV) light to erase the cells, an electrical signal is used. The term "flash" refers to the fact that the flash EEPROM can be erased much more quickly than an EPROM.

A memory cell is typically read by coupling the source of the cell to ground potential. The memory cell is programmed by coupling the source of the cell to either ground potential or some positive voltage, depending on the configuration of the memory cell. The memory cell is typically erased by applying a relatively high voltage to the source of the memory cell while simultaneously grounding the cell floating gate. Typically, the voltage applied to the source is between about 10 and 14 volts for 0.5 um CMOS technology and between about 8 and 12 volts for 0.25 um CMOS technology. The voltage applied to the source must have a magnitude sufficient to effect transfer of electrons from the cell floating gate to the source region by Fowler-Nordheim tunneling.

Typically, discharge circuits are used to couple the source of the memory cell to ground potential during a read cycle or during a program cycle, and isolate the source of the memory cell from ground potential during the erase cycle. Typically, such discharge circuits utilize FETs (field effect transistors). Due to the relatively high voltage applied to the source of the memory cell during the erase cycle, the gate-to-source ($V_{gs}$) and drain-to-source ($V_{ds}$) voltages of the FETs are significantly increased to voltage levels which result in a relatively high electric field through the gate oxide thereby causing severe stress to the gate oxide. Such stress adversely affects the reliability of the memory and thus reduces the number of times the flash EEPROM can be programmed, read or erased.

Several attempts have been made to correct or alleviate the aforementioned problem. In one attempt, the stress endurance of the FET in the ground discharge path is improved by enlarging the FET's channel length. However, such a technique can result in costly modifications to the fabrication process used to produce the flash EEPROM. Furthermore, enlarging the channel length increases the overall die size of the EEPROM. In another attempt, the FETs are series-stacked. However, due to the body effect, the voltage burden upon the series FETs is unevenly distributed. In particular, the FET which is the most distant from ground potential has a relatively significant $V_{ds}$ voltage drop and $V_{gs}$ voltage drop. Such a condition will adversely affect the reliability of the memory thereby reducing the number of times the EEPROM can be programmed, read and erased.

Bearing in mind the problems and deficiencies of conventional discharge circuits, it is therefore an object of the present invention to provide a FET discharge circuit that maintains the gate-to-source, and drain-to-source voltages at predetermined voltage levels.

It is further object of the present invention to provide a discharge circuit that has a minimum number of components therein.

It is another object of the present invention to provide a discharge circuit that facilitates switching among read, program and erase cycles.

It is a further object of the present invention to provide a discharge circuit that can be easily integrated with semiconductor memories.

SUMMARY OF THE INVENTION

The above and other objects and advantages, which will be apparent to those skilled in the art, are achieved in the present invention which is directed to, in a first aspect, an apparatus comprising a first node, a second node for receiving a control signal having first and second states, and a circuit connected between the first node and ground potential and to the second node. The circuit couples the first node to ground potential when the control signal has the first state and substantially isolates the first node from ground potential when the control signal has the second state. The circuit comprises a first subcircuit for defining a current path between the first node and ground potential. The first subcircuit comprises a plurality of transistors, each of which has a gate, source and drain. The circuit further comprises a second subcircuit for effecting predetermined gate-to-source, and drain-to-source voltages of the transistors of the first subcircuit when the control signal has the second state.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjuction with the accompanying drawings in which:

DESCRIPTION OF THE PREFERRED EMBODIMENTS

In describing the preferred embodiment of the present invention, reference will be made herein to FIGS. 1-11 of the drawings in which like numerals refer to like features of the invention.

Figure 1:
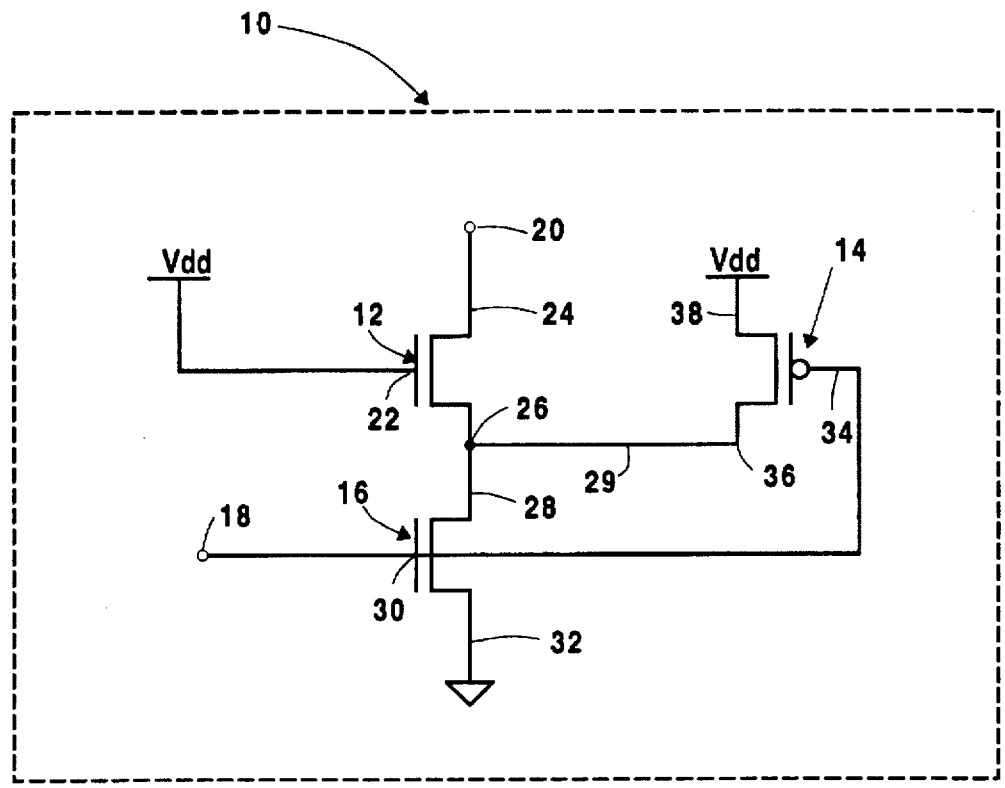
FIG. 1 is a circuit diagram of the discharge circuit of the present invention.
Figure 1A:
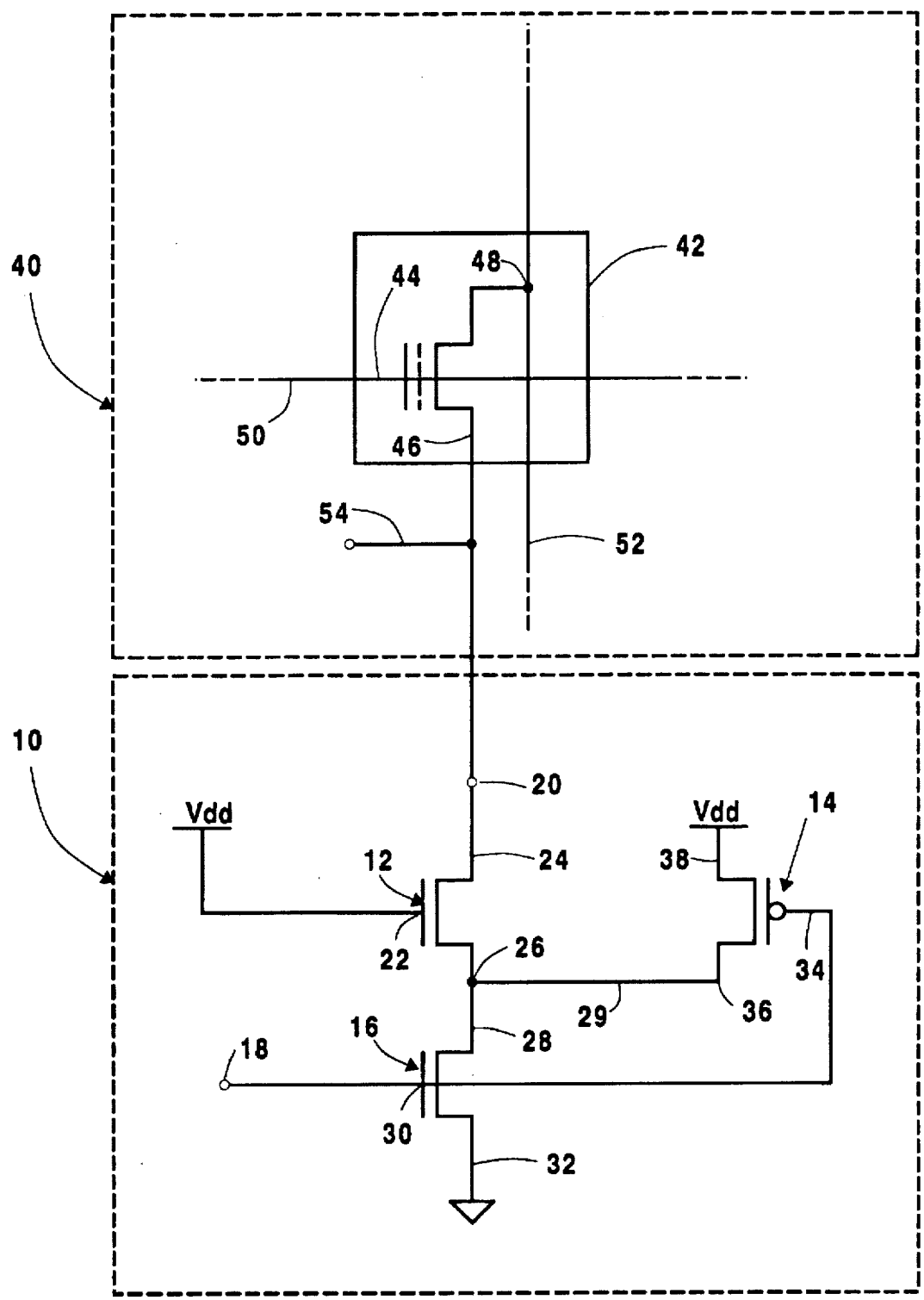
FIG. 1A is a circuit diagram of the discharge circuit shown in FIG. 1 operatively connected to a semiconductor memory.

Referring to FIG. 1, discharge circuit 10 of the present invention comprises FETs 12, 14 and 16, control line 18 and terminal 20. All FETs used in the circuits described herein are MOSFETs (metal oxide semiconductor field effect transistor). FETs 12 and 16 are n-channel FETs and FET 14 is a p-channel FET. FETs 12 and 16 form one sub-circuit which defines a discharge path to ground potential. FET 14 forms another sub-circuit, the function of which is to control the bias voltages of the FETs such that the $V_{gs}$ and $V_{ds}$ of FETs 12 and 16 are within a predetermined range of voltages. The predetermined range of voltage depends on the supply voltage $V_{dd}$ utilized. It is preferred that $V_{ds}$ be less than or equal to $V_{dd}$ and $V_{gs}$ be less than or equal to $2 \times V_{dd}$ wherein "x" denotes multiplication. $V_{dd}$ is typically 5 volts d.c. for peripheral circuitry associated with EEPROMS. If $V_{dd}$ is equal to 5 volts, then it is highly preferable that $V_{gs}$ and $V_{ds}$ are less than or equal to seven (7) volts d.c. Gate 22 of FET 12 is coupled to supply voltage $V_{dd}$. Drain 24 of FET 12 is coupled to terminal 20. Source 26 of FET 12 is coupled to drain 28 of FET 16. Gate 30 of FET 16 is coupled to control line 18, and source 32 is coupled to ground potential. Gate 34 of p-channel FET 14 is coupled to control line 18. Drain 36 of FET 14 is coupled to source 26 of FET 12 and drain 28 of FET 16. Source 26 and drains 28 and 36 define node 29. Source 38 of FET 14 is coupled to supply voltage $V_{dd}$. In a preferred embodiment, $V_{dd}$ is about 5 volts d.c. (direct current). Referring to FIG. 1A, discharge circuit 10 is shown operatively coupled to nonvolatile semiconductor memory 40. Memory 40 can be a flash-EEPROM memory. Memory 40 includes at least one memory cell 42 that includes gate 44, source 46 and drain 48. Cell 42 is controlled by control lines 50 and 52, the function of which is beyond the scope of the present invention. Terminal 20 of discharge circuit 10 is coupled to source 46 of cell 42.

In accordance with the discharge circuit of the present invention, when memory cell 42 is to be read, source 46 of cell 42 is coupled to ground potential. If it is desired to program cell 42, then source 46 of cell 42 is preferably coupled to ground potential. When cell 42 is to be erased, source 46 is coupled to a relatively high voltage potential, preferably between 12 and 15 volts d.c., inclusive. Such a voltage potential can be coupled to high voltage line 54 and supplied by a charge pump or an external power supply. Discharge circuit 10 effects the coupling of source 46 to the aforementioned voltage potentials in order to initiate the read, erase and program functions. Specifically, when cell 42 is to be read or programmed, control line 18 is raised to a positive voltage potential of about 5 volts d.c. or a logic "1" voltage potential. When this occurs, an electrically conductive path is established between drain 28 and source 32. Since FET 14 is a p-channel FET, source 38 is substantially isolated from drain 36. Thus, FET 14 is "off" when control line 18 has a voltage potential of 5 volts d.c. Since gate 22 of FET 12 is always coupled to $V_{dd}$, a constant electrically conductive path is established between drain 24 and source 26. Thus, when control line 18 has a voltage potential sufficient to establish a conductive path between drain 28 and source 32, source 46 of memory cell 42 is coupled to ground potential.

When control line 18 has a low voltage potential, e.g. 0 volts, or a logic "0" voltage potential, drain 28 of FET 16 is substantially electrically isolated from source 32 thereby "turning off" the discharge path to ground and substantially isolating source 46 of cell 42 from ground potential.

Figure 2:
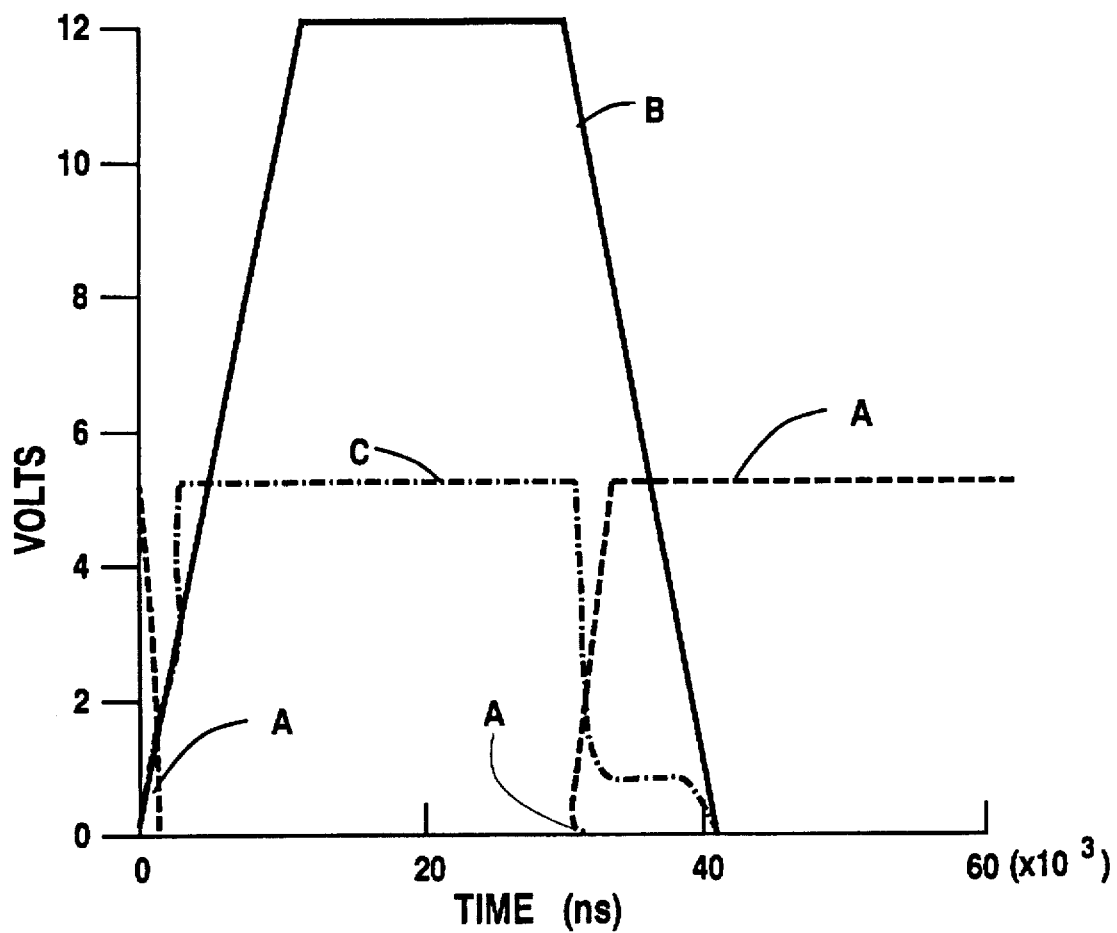
FIG. 2 is a graph of the operating characteristics of the discharge circuit of FIG. 1.

FIG. 2 shows a graph of the transient response at various nodes of circuit 10 as the magnitude of the voltage on control line 18 is switched between a logic "1" voltage potential and a logic "0" voltage potential. The unit of time for the horizontal time axis shown in FIG. 2, as well as in FIGS. 4, 5, 7, and 9, are in nanoseconds (ns). Each value of time is in the thousands, e.g. $20 \times 10^3$, $30 \times 10^3$, $40 \times 10^3$, etc. wherein "x" denotes multiplication. The letter A designates the voltage waveform on control line 18. The letter B designates the response at source 46 of memory cell 42. The letter C designates the response at node 29 (junction of source 26 and drains 28, 36; see FIG. 1). As shown by the graph, when an erase voltage of about 12 volts is applied to line 54 and control line 18 has a voltage potential of about 0 volts, source 46 of cell 42 has a voltage potential of about 12 volts. As described above, this voltage potential is applied to source 46 by a charge pump or an external supply voltage. When the voltage potential of line 18 rises to about five (5) volts, the potential of source 46 of cell 42 decreases to about 0 volts or ground potential. When an erase voltage potential of about 12 volts is applied to the source 46 of cell 42 and the voltage potential of control line 18 is about 0 volts, the $V_{gs}$ and $V_{ds}$ of the FETs of circuit 10 have the voltage potentials shown in Table 1.

TABLE I

|  | FET 12 | FET 14 | FET 16 |
|---|---|---|---|
| $\|V_{gs}\|$ | 0 | 5 | 0 |
| $\|V_{ds}\|$ | 7 | 0 | 5 |

Since the $V_{gs}$ and $V_{ds}$ of FETs 12, 14 and 16 are at typical voltage levels suitable for FET transistors, electric fields across the junctions in each FET and the stress applied to the FET-gate oxide are minimized. Thus, circuit 10 effects full voltage protection of FETs 12, 14 and 16 during erase cycles when relatively high voltage potentials are applied to source 46 of cell 42.

Figure 3:
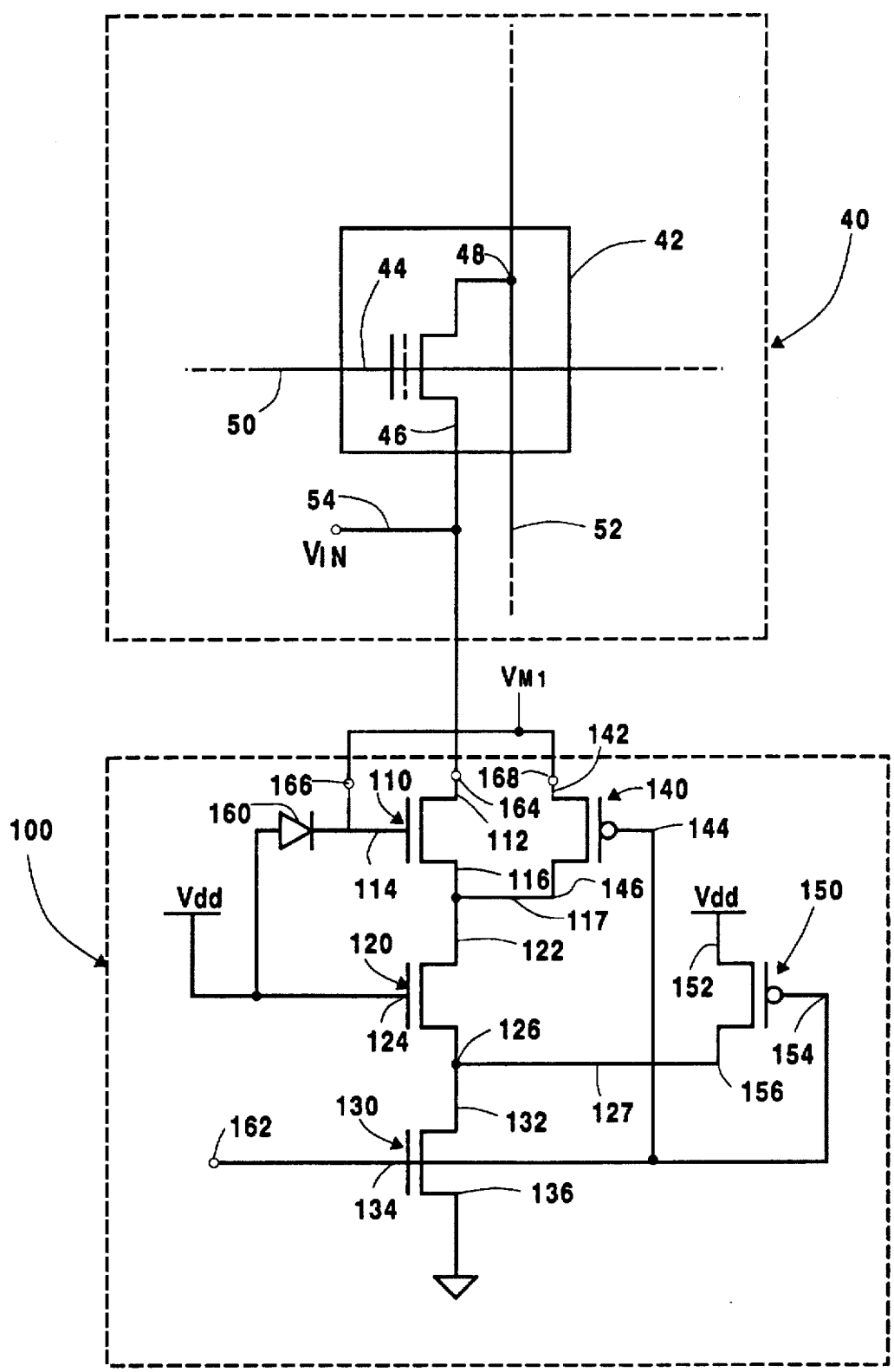
FIG. 3 is a circuit diagram of an alternate embodiment of the discharge circuit of the present invention operatively connected to a semiconductor memory.

Referring to FIG. 3, alternate discharge circuit 100 of the present invention is shown. Circuit 100 is configured for erase voltages that are greater than 12 volts. Circuit 100 comprises n-channel FETs 110, 120 and 130, p-channel FETs 140, 150 and diode 160. FETs 110, 120, and 130 form one sub-circuit that defines a discharge path between source 46 of cell 42 and ground potential. FETs 140 and 150 form another sub-circuit, the function of which is to control the bias voltages of the FETs such that the $V_{gs}$ and $V_{ds}$ of FETs 110, 120 and 130 are within a predetermined range of voltages. The predetermined range of voltages depends on the supply voltage $V_{dd}$ utilized. It is preferred that $V_{ds}$ be less than or equal to $V_{dd}$ and $V_{gs}$ be less than or equal to $2 \times V_{dd}$ wherein "x" denotes multiplication. $V_{dd}$ is typically 5 volts d.c. for peripheral circuitry associated with EEPROMS. If $V_{dd}$ is equal to 5 volts, then it is highly preferable that $V_{gs}$ and $V_{ds}$ are less than or equal to seven (7) volts d.c. FET 110 comprises drain 112, gate 114 and source 116. FET 120 comprises drain 122, gate 124 and source 126. FET 130 comprises drain 132, gate 134 and source 136. FET 140 comprises source 142, gate 144 and drain 146. FET 150 comprises source 152, gate 154 and drain 156. Circuit 100 further includes diode 160, control line 162 and node 164 which is coupled to source 46 of memory cell 42. Gate 124 of FET 120 and source 152 of FET 150 coupled to $V_{dd}$. In a preferred embodiment, $V_{dd}$ is about 5 volts. Diode 160 is coupled between $V_{dd}$ and gate 114 of FET 110 and functions as a blocking diode. Nodes 166 and 168 are coupled to a first intermediate voltage $V_{M1}$, which can be produced by a charge pump or a resistive network as described below. Intermediate voltage $V_{M1}$ is coupled to port 166 and used to tie down or clamp gate 114 of FET 110 to reduce large voltage drops from gate 114 to drain 112 and from gate 114 to source 116 ($V_{gs}$). Intermediate voltage $V_{M1}$ is a predetermined fraction of the erase voltage applied to the source 46 of cell 42. Similarly, intermediate voltage $V_{M1}$ is also coupled to port 168 and ties down source 142 of FET 140 to $V_{M1}$ volts in order to reduce the $V_{gs}$ and $V_{ds}$ of FET 140. Thus, intermediate voltage $V_{M1}$ significantly reduces the electric field across the junctions which is created by hot-electron stress or stress applied to the gate oxides of FETs 110, 120, 130 and 140 when the source line is connected to a relatively high voltage potential, above 12 volts, to erase the logic state of the flash EEPROM.

Figure 10A:
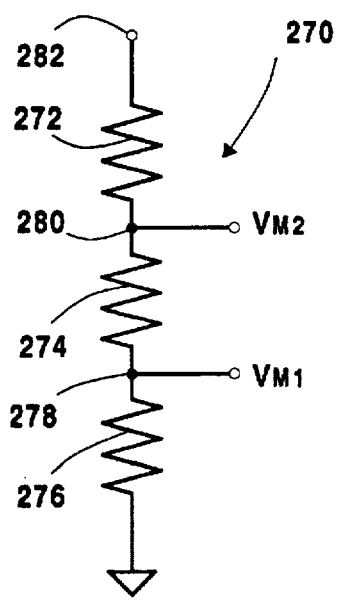
FIGS. 10A and 10B are circuit diagrams of resistive networks used for providing intermediate voltages used by the alternate embodiments of the present invention.
Figure 10B:
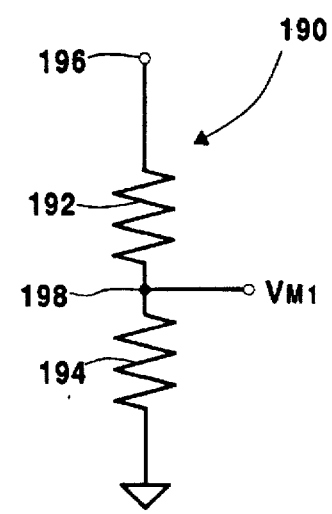
Figure 11:
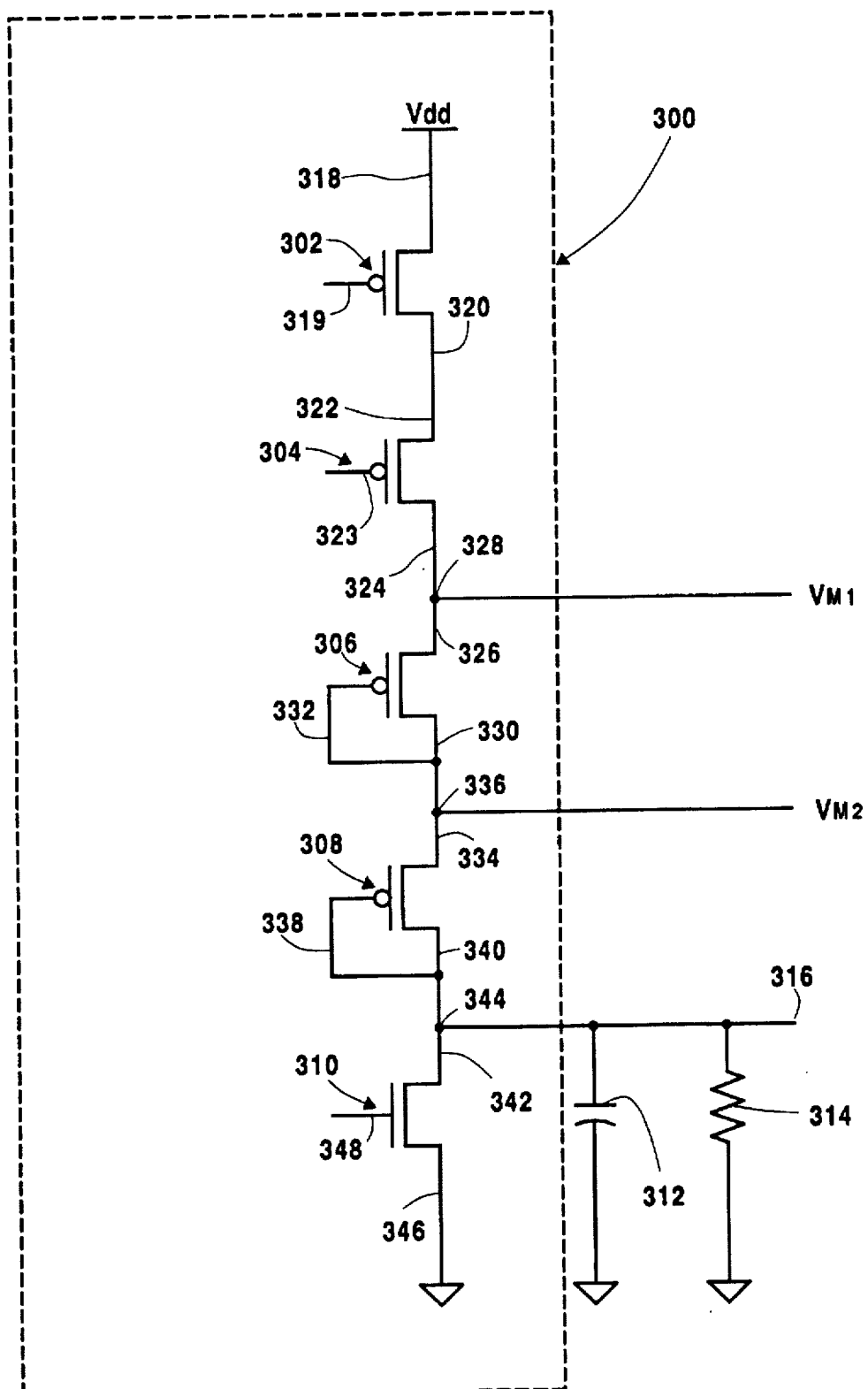
FIG. 11 is a circuit diagram of a charge pump used for providing intermediate voltages for use by the alternate embodiments of the present invention.

Intermediate voltage $V_{M1}$ may be produced by either charge pump 170, as shown in FIG. 11, or resistor network 190 shown in FIG. 10B. Charge pump 170 will be discussed below in further detail. Resistor network 190 comprises resistors 192 and 194. Node 196 is coupled to source 46 of memory cell 42. In a preferred embodiment, resistors 192 and 194 have resistances of about 1.01 Mohm (megaohm) and 2.0 Mohm, respectively. In the erase mode, source 46 of cell 42 is coupled to a relatively high voltage source $V_{IN}$ which is applied to line 54. Thus, the intermediate voltage $V_{M1}$ produced at node 198 is:

$$V_{M1} = \frac{R_{194}}{R_{192}+R_{194}} (V_{IN}) = \frac{2.0}{3.01} (15 \text{ volts}) = 9.97 \text{ volts}$$

Figure 4:
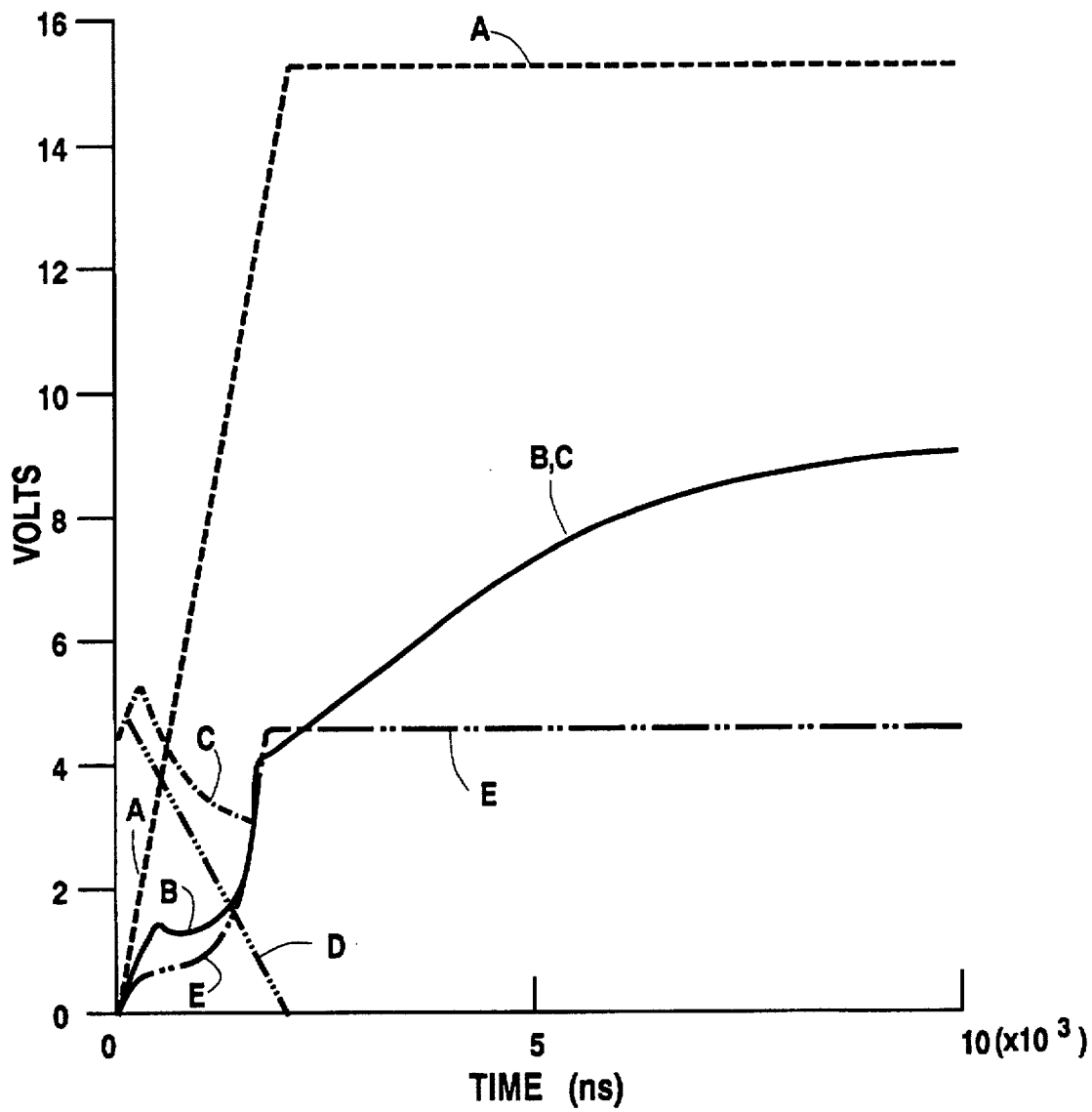
FIGS. 4 and 5 are graphs of the operating characteristics of the discharge circuit shown in FIG. 3.

For example, if $V_{IN}$ is about 15 volts, then $V_{M1}$ is equal to about 9.97 volts. FIG. 4 shows a graph that illustrates the transient response at various nodes of discharge circuit 100 when the control voltage on line 162 is reduced to a logic "0" level. The letter A designates the voltage potential applied to node 54. During the "erase" mode, the voltage potential applied to node 54 is increased to about 15 volts. The letter B designates the voltage potential at node 117. The letter C designates the voltage potential of $V_{M1}$. When control line 162 has a 0 volt potential (designated by letter D), p-channel FET 140 is "turned on" thereby establishing a conductive path between source 142 and drain 146. Therefore, since source 142 is coupled to node 168 which is coupled to $VM_1$, node 117 has a voltage potential that is substantially equal to $V_{M1}$. The letter E represents the voltage potential at node 127. When control line 162 has a voltage potential of 0 volts, p-channel FET 150 is "turned on" thereby establishing a conductive path between source 152, which is coupled to $V_{dd}$, and drain 156, which is part of node 127. Thus, node 127 has a voltage potential substantially equal to $V_{dd}$, which is preferably about 5 volts. Thus, when an "erase" voltage $V_{IN}$ of about 15 volts is applied to node 54, the $V_{gs}$ and $V_{ds}$ of the FETs of circuit 100 have the voltages, in volts, shown in Table II-A.

TABLE II A

|  | FET 110 | FET 120 | FET 130 | FET 140 | FET 150 |
|---|---|---|---|---|---|
| $|V_{gs}|$ | 0 | 0 | 0 | 10 | 5 |
| $|V_{ds}|$ | 5 | 5 | 5 | 0 | 0 |

Figure 5:
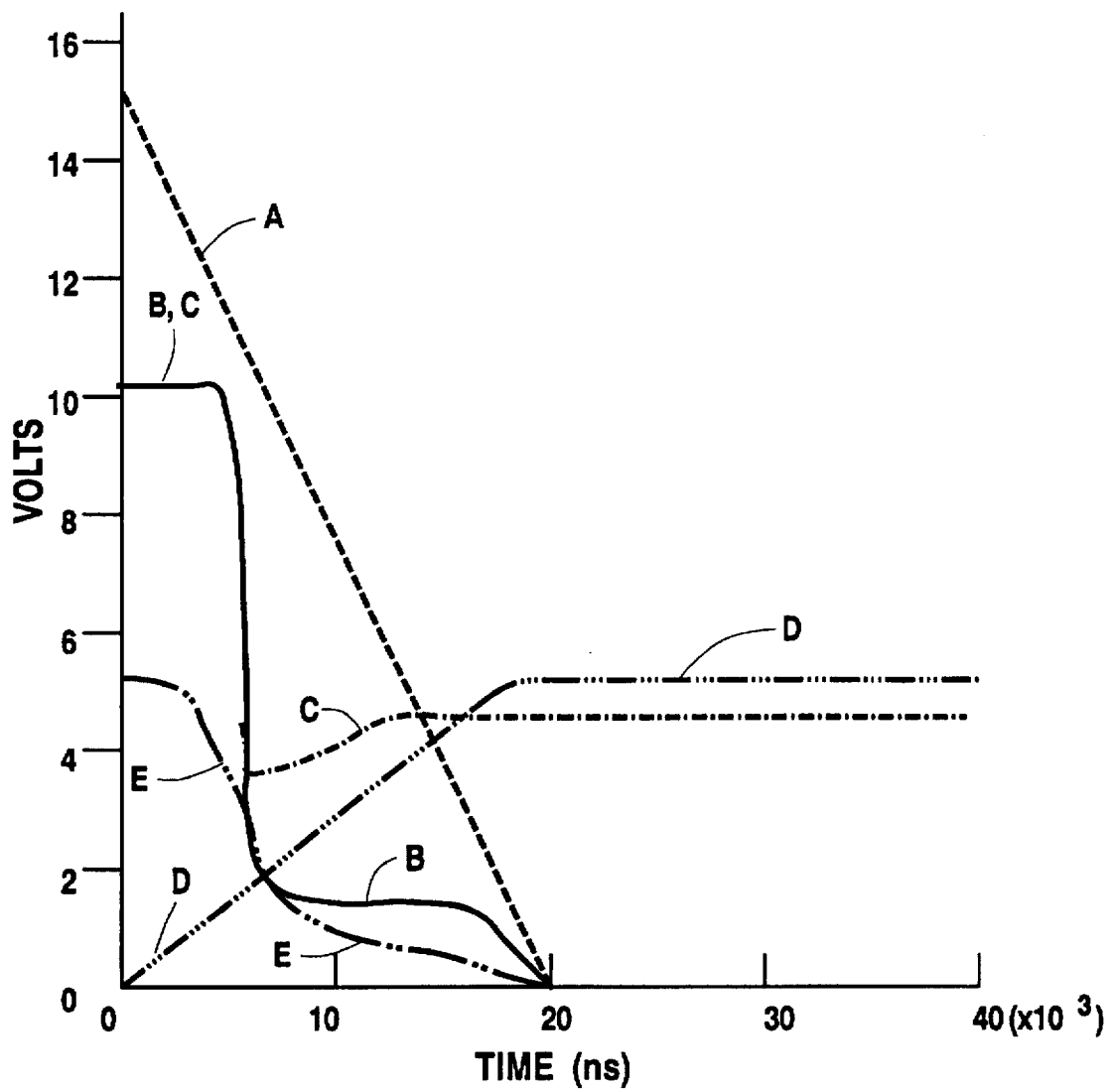

Since the $V_{gs}$ and $V_{ds}$ of FETs 110, 120, 130, 140 and 150 of circuit 100 are at typical voltage levels, electric fields across the junctions in each FET and the stress applied to the gate oxide of each FET are minimized. Thus, circuit 100 effects full voltage protection of FETs 110, 120, 130, 140 and 150 during erase cycles when erase voltages greater than 12 volts are applied to the source 46 of memory all 42. The utilization of intermediate voltage $V_{M1}$ provides full voltage protection of FETs 110, 120, 130, 140 and 150 of discharge circuit 100. FIG. 5 illustrates the transient response for nodes 54, 117, $V_{M1}$, control line 162 and node 127 which are presented by letters A, B, C, D and E, respectively, when the source 46 of memory cell 42 is decreased to substantially 0 volts in order to read or program the flash EEPROM. FIG. 5 shows a graph that illustrates the transient response at various nodes of discharge circuit 100 when the control voltage on line 162 is increased to a logic "1" level. Table II-B below shows $V_{gs}$ and $V_{ds}$ of FETs 110, 120, 130, 140 and 150 when line 162 has a logic "1" voltage level and the source 46 of all 42 is coupled to ground potential by the discharge path created by FETs 110, 120 and 140.

TABLE II B

|  | FET 110 | FET 120 | FET 130 | FET 140 | FET 150 |
|---|---|---|---|---|---|
| $|V_{gs}|$ | 5 | 5 | 5 | 0 | 0 |
| $|V_{ds}|$ | 0 | 0 | 0 | 5 | 5 |

Thus, discharge circuit 100 offers sufficient gate oxide reliability and may be used with 0.5 um (micrometer) generation flash EEPROMS.

Figure 6:
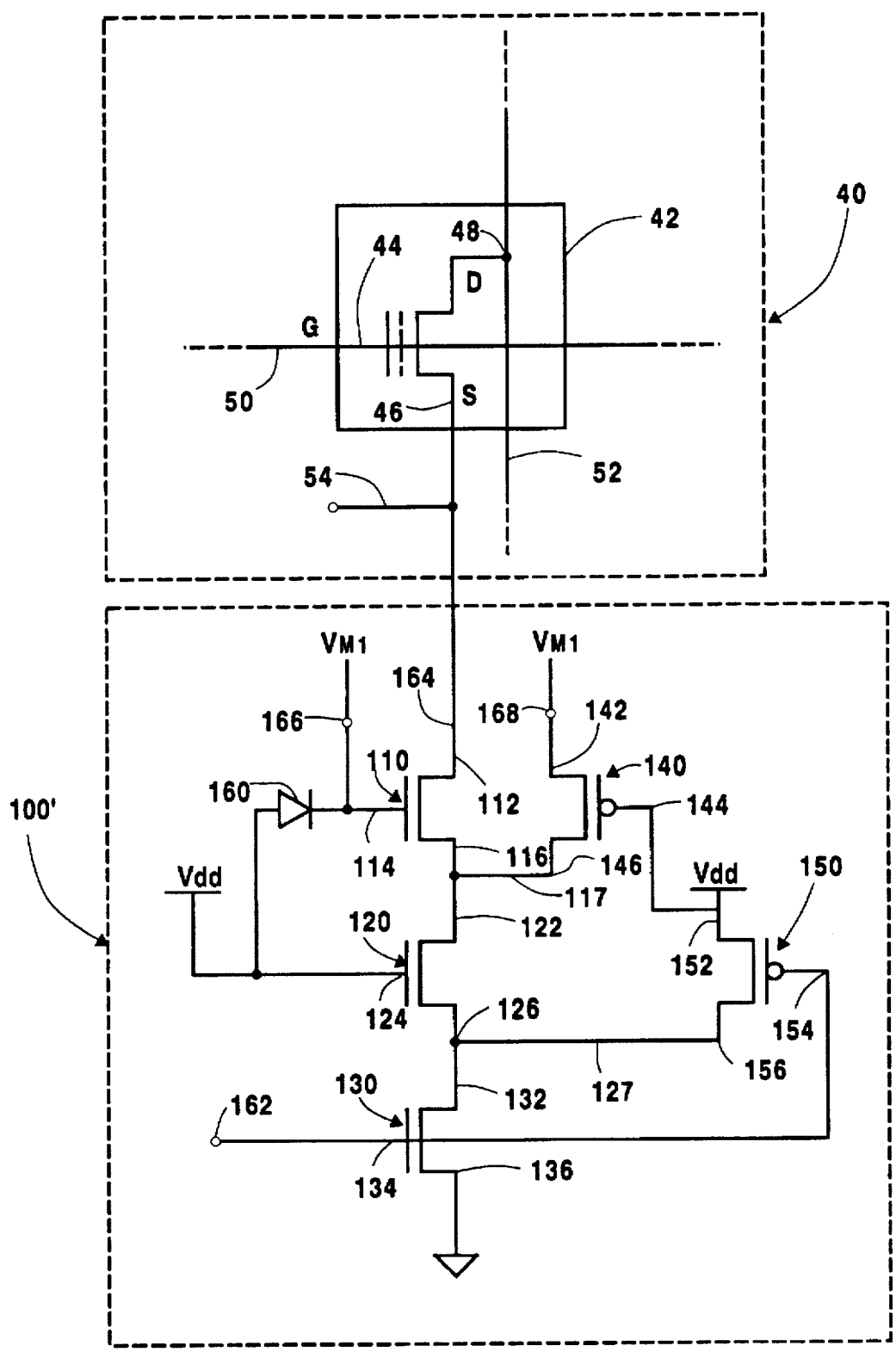
FIG. 6 is a circuit diagram of an alternate embodiment of the discharge circuit of the present invention operatively connected to a semiconductor memory.
Figure 7:
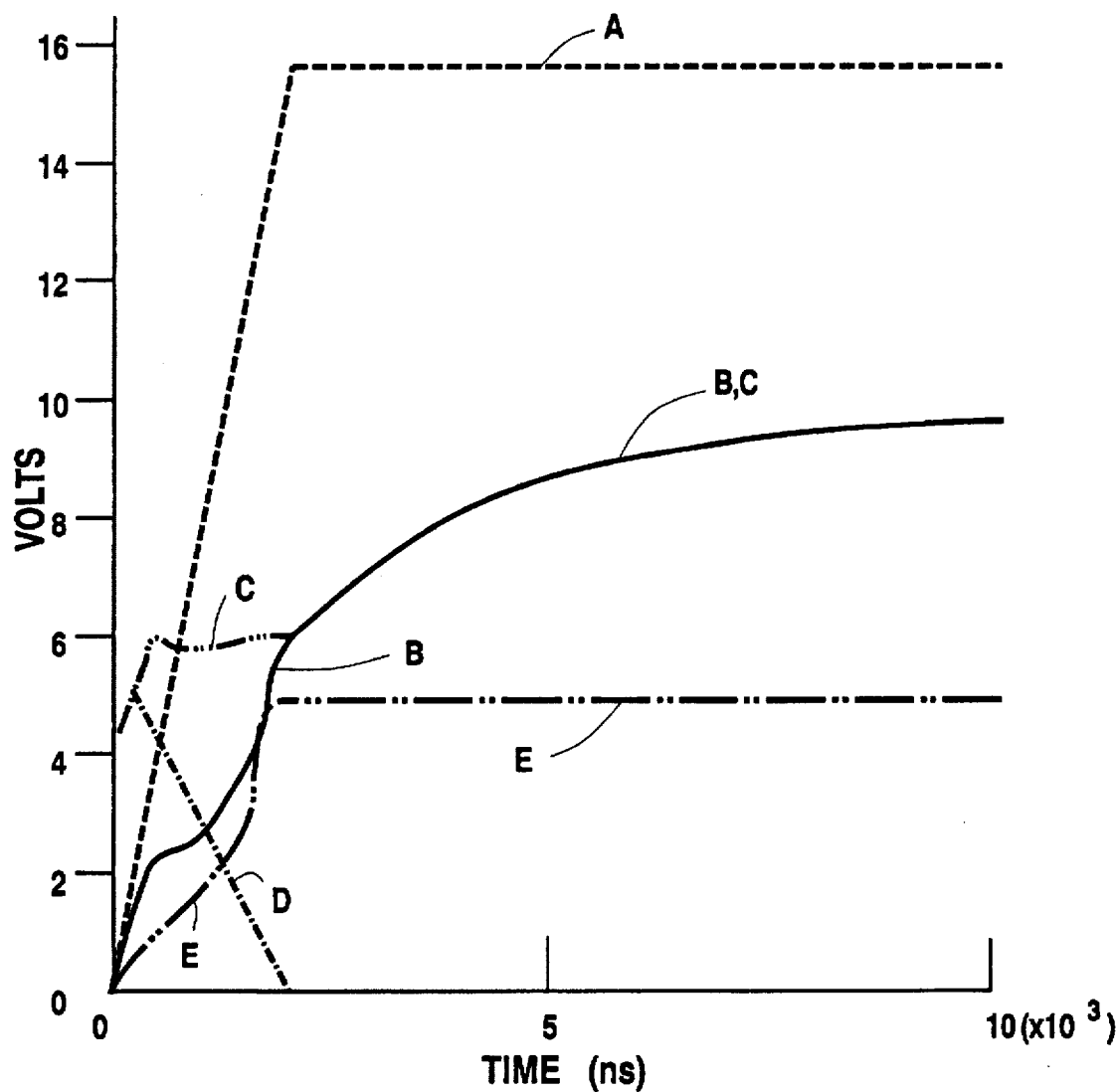
FIG. 7 is a graph of the operating characteristics of the discharge circuit shown in FIG. 6.

FIG. 6 shows an alternate embodiment of the discharge circuit of the present invention which is suitable for use with sub-0.25 um CMOS flash EEPROMS. Discharge circuit 100' is also of the "double-tapping" configuration and substantially identical to discharge circuit 100 with the exception that gate 144 of p-channel FET 140 is coupled to $V_{dd}$ instead of control line 162. Thus, FET 140 is biased off when $V_{M1}$ is less than $V_{dd}$ by more than the threshold voltage, $|V_{TH}|$, which substantially isolates source 142 from drain 146. FIG. 7 shows the transient response of circuit 100'. The letters A–E refer to the transient response at the same nodes and points described in circuit 100 and the graph in FIG. 5. During the erase mode, control line 162 (letter D) is decreased to about 0 volts and the potential of node 54, source 46 of cell 42, is increased to about 15 volts. Since the potential of node 54 increases, $V_{M1}$ increases as well. As $V_{M1}$ increases, $|V_{gs}|$ of FET 140 also increases. When $|V_{gs}|$ of FET 140 is greater than the threshold voltage, $|V_{TH}|$, an electrically conductive path is produced between source 142 and drain 146 thereby coupling node 117 to $V_{M1}$. Table III shows $V_{gs}$ and $V_{ds}$ of all FETs in discharge circuit 100':

TABLE III

|  | FET 110 | FET 120 | FET 130 | FET 140 | FET 150 |
| --- | --- | --- | --- | --- | --- |
| $|V_{gs}|$ | 0 | 0 | 0 | 5 | 5 |
| $|V_{ds}|$ | 5 | 5 | 5 | 0 | 0 |

Since the $V_{gs}$ and $V_{ds}$ of FETs 110, 120, 130, 140 and 150 of circuit 100' are at typical voltage levels, electric fields across the junctions in each FET and the stress applied to the gate oxide of each FET are minimized. Thus, circuit 100' effects full voltage protection of FETs 110, 120, 130, 140 and 150 during erase cycles when an erase voltage greater than 12 volts, e.g. 15 volts, is applied to the source 46 of memory all 42.

Figure 8:
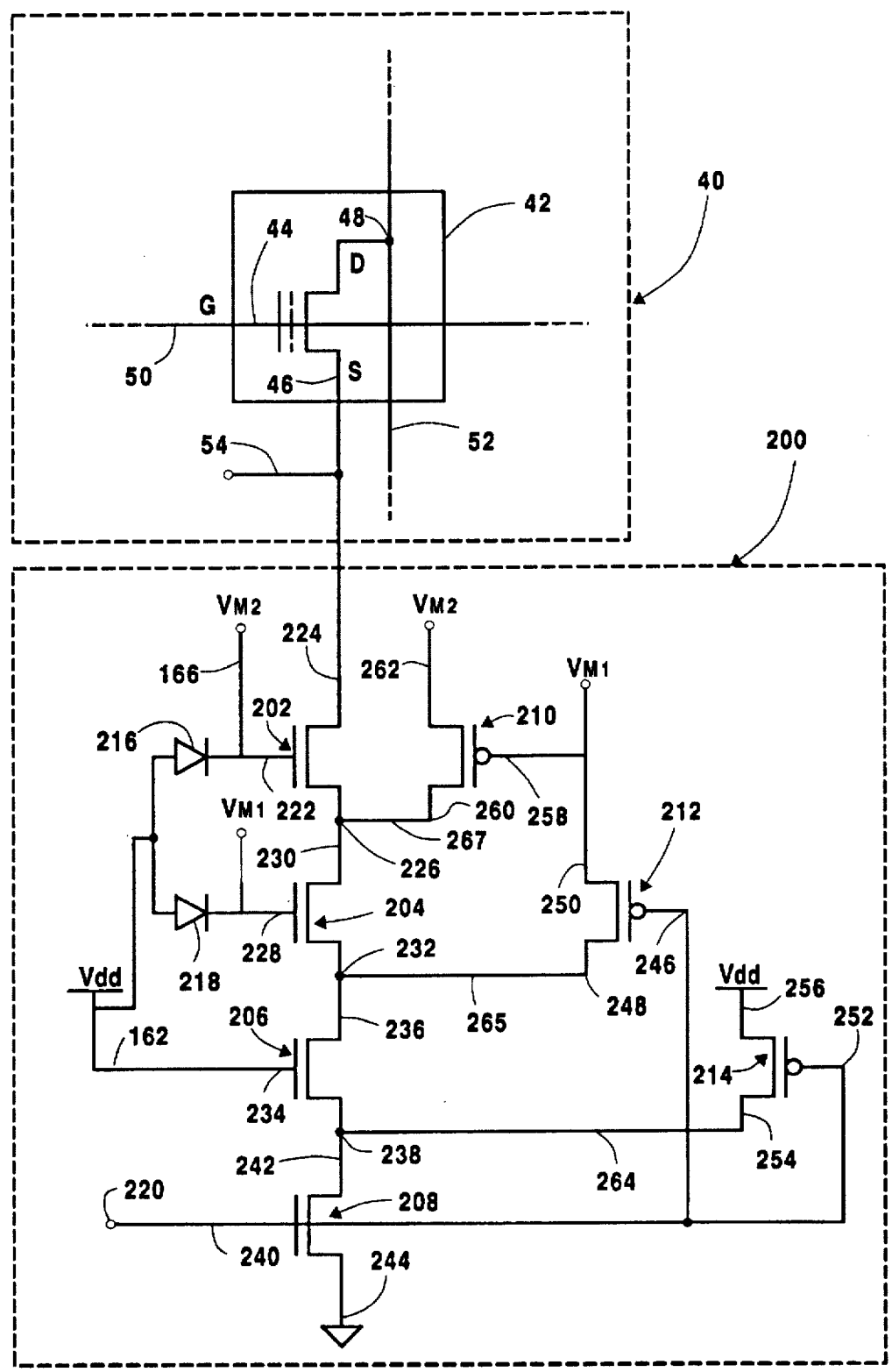
FIG. 8 is a circuit diagram of an alternate embodiment of the discharge circuit of the present invention.

Referring to FIG. 8, an alternate embodiment of the present invention is shown. FIG. 8 shows a "triple tapping" configuration which can be used with flash EEPROMS that use an erase voltage greater than 15 volts, e.g. 20 volts. Circuit 200 comprises n-channel FETs 202, 204, 206 and 208, p-channel FETs 210, 212 and 214, and diodes 216, 218. Control line 220 receives a voltage potential of either about 0 or 5 volts. Control line 220 has a voltage potential of about 0 volts (logic "0") during the erase mode and a voltage potential of about 5 volts (logic "1") when the flash EEPROM is to be read or programmed. FET 202 comprises gate 222, drain 224 and source 226. FET 204 comprises gate 228, drain 230 and source 232. FET 206 comprises gate 234, drain 236 and source 238. FET 208 comprises gate 240, drain 242 and source 244. P-channel FET 212 comprises gate 246, drain 248 and source 250. FET 214 comprises gate 252, drain 254 and source 256. FET 210 comprises gate 258, drain 260 and source 262. The anodes of diodes 216 and 218 and gate 234 of FET 206 are coupled to $V_{dd}$. Source 256 of FET 214 is also coupled to $V_{dd}$. Circuit 200 utilizes two (2) intermediate voltages $V_{M1}$ and $V_{M2}$. $V_{M1}$ and $V_{M2}$ may be produced by either resistor network 270, shown in FIG. 10A, or charge pump circuit 300, shown in FIG. 11. Referring to FIG. 10A, resistor network 270 comprises resistors 272, 274, and 276. In a preferred embodiment, resistors 272, 274 and 276 have resistances of about 1.01 Mohm, 1.01 Mohm and 2 Mohms, respectively. $V_{M1}$ is the potential at node 278 and $V_{M2}$ is the potential at node 280. Node 282 is coupled to source 46 of memory cell 42 and node 54. During the erase cycle, voltage $V_{IN}$ is about 20 volts and is applied to node 54 (and source 46). Thus:

$$V_{M1} = \frac{R_{276}}{R_{272} + R_{274} + R_{276}} (V_{IN}) = \frac{2}{4.02} (20) \approx 10 \text{ v}$$

and $$V_{M2} = \frac{R_{274} + R_{276}}{R_{272} + R_{274} + R_{276}} (V_{IN}) = \frac{3.01}{4.02} (20) \approx 15 \text{ v}$$

Intermediate voltages $V_{M1}$ and $V_{M2}$ may also be produced by charge pump 300 shown in FIG. 11. Pump 300 comprises p-channel FETs 302, 304, 306, 308, n-channel FET 310, capacitor 312 and resistor 314. Pump 300 also comprises additional circuitry, which is not shown, the discussion of which is beyond the scope of the present invention. Line 316 is coupled to node 54 and source 46 of memory cell 42 (see FIG. 8). Source 318 of FET 302 is coupled to $V_{dd}$. Drain 320 of FET 302 is coupled to source 322 of FET 304. Drain 324 of FET 304 is coupled to source 326 of FET 306. Drain 324 and source 326 define node 328 which provides $V_{M1}$. Drain 330 of FET 306 is coupled to gate 332 of FET 306 and source 334 of FET 308. Drain 330 and source 334 define node 336 which provides $V_{M2}$. Gate 338 of FET 308 is coupled to drain 340 of FET 308 and drain 342 of FET 310. Gate 338 and drain 340 of FET 308, drain 342 of FET 310, capacitor 312, and resistor 314 define node 344 which is coupled to line 316. Source 346 of FET 310 is coupled to ground potential. Preferably, a voltage potential that is less than or equal to $V_{dd}$ is applied to gates 319, 323 and 348 of FETS 302, 304 and 310. During the erase mode, charge pump 300 outputs a voltage potential on line 316 of 20 volts. However, modifications may be made to charge pump 300 to provide an "erase voltage" less than 20 volts.

Figure 9:
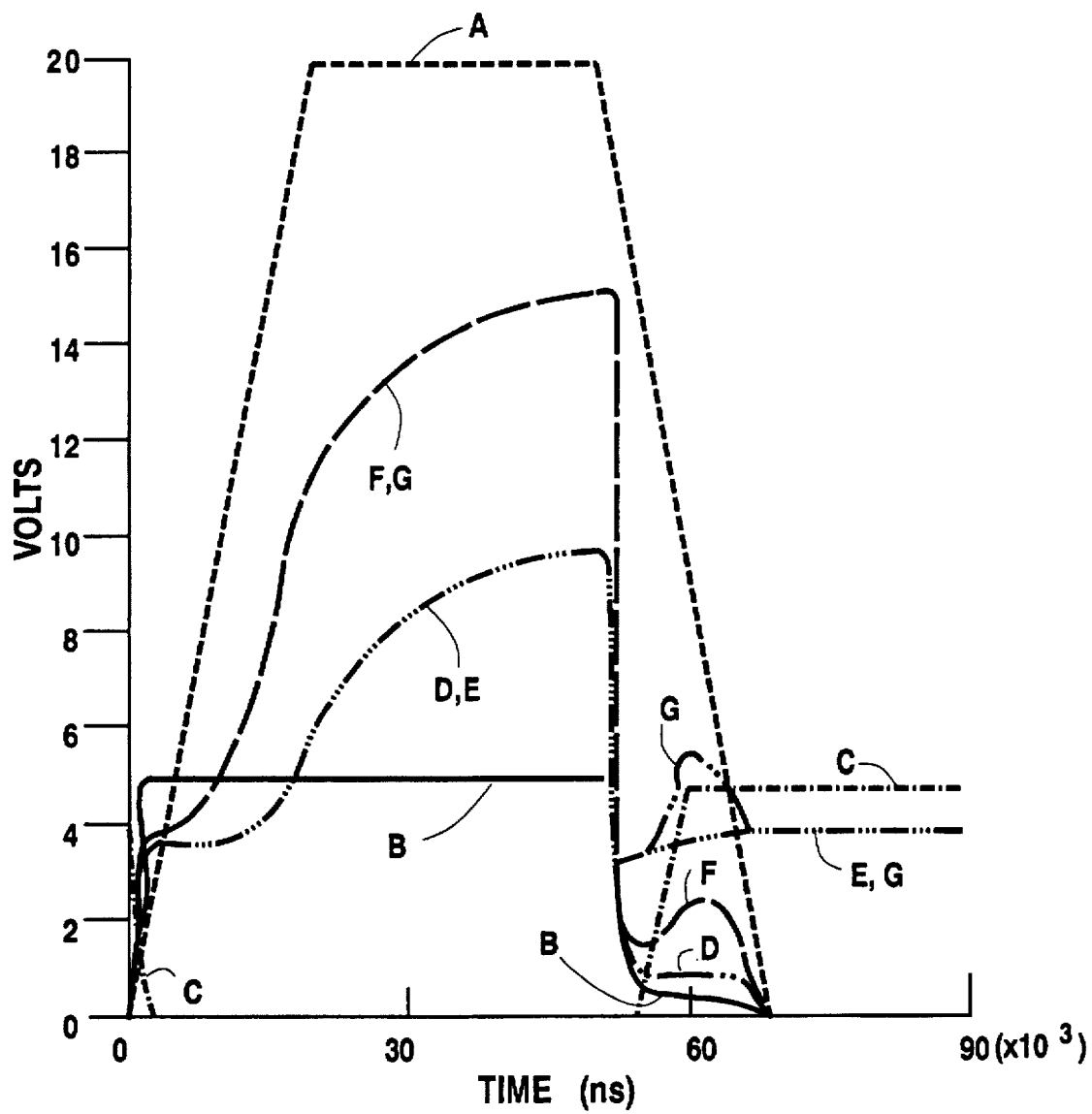
FIG. 9 is a graph of the operating characteristics of the discharge circuit of FIG. 8.

Referring to FIG. 8, gate 222 of FET 202 and source 262 of FET 210 are coupled to $V_{M2}$. Gate 228 of FET 204, gate 258 of FET 210 and source 250 of FET 212 are coupled to $V_{M1}$. Referring to FIG. 9, a voltage potential of about 20 volts is applied, by either charge pump 300 or an external power supply, to erase flash EEPROM 40. Letter A designates the voltage potential of source 46 of memory cell 42. Letter C designates the voltage potential of control line 220. During the erase cycle, this potential is decreased to about 0 volts thereby substantially isolating drain 242 from ground potential so as to "turn off" FET 208 and thus, the bleed path between ground potential and source 46 of memory cell 42. When control line 220 has a voltage potential that is at 0 volts, p-channel FETs 212 and 214 are "turned on". Thus, a substantially conductive path exists between source 256 and drain 254 of FET 214. This results in drain 254 of FET 214 and source 238 of FET 206 having a potential substantially equal to $V_{dd}$, i.e. about 5 volts. Drain 254, source 238 and drain 242 define node 264. The response at node 264 is designated by letter B in the graph of FIG. 9. Drain 248 of FET 212, source 232 of FET 204 and drain 236 of FET 206 define node 265. The response at node 265 is designated letter D. When FET 212 is "turned on ", a substantially conductive path exist between source 250 and drain 248. Thus, the voltage potential of node 265 is substantially equal to $V_{M1}$ i.e. about 10 volts. Letter E designates the voltage potential of $V_{M1}$ during the erase cycle. As shown in the graph of FIG. 9, the potential of node 265 eventually rises to a voltage that is substantially equal to $V_{M1}$.

Drain 260 of FET 210, drain 230 of FET 204 and source 226 of FET 202 define node 267. The response at node 267 is designated by letter F in the graph of FIG. 9. $V_{M1}$ and $V_{M2}$ rise in response to the erase mode voltage at node 54, with $V_{M2}$ greater than $V_{M1}$ from the voltage divider or charge pump. When $|V_{gs}|$ of FET 210 is greater than the threshold voltage, $|V_{TH}|$, an electrically conductive path is produced between source 262 and drain 260 thereby coupling node 267 to $V_{M2}$ (designated by the letter G). The $V_{gs}$ and $V_{ds}$ for the FETs in circuit 200, when control line has a logic "0" voltage potential, are shown in Table IV below.

TABLE IV

|  | FET 202 | FET 204 | FET 206 | FET 208 | FET 210 | FET 212 | FET 214 |
| --- | --- | --- | --- | --- | --- | --- | --- |
| $|V_{gs}|$ | 0 | 0 | 0 | 0 | 5 | 10 | 5 |
| $|V_{ds}|$ | 5 | 5 | 5 | 5 | 0 | 0 | 0 |

Since the $V_{gs}$ and $V_{ds}$ of FETs of circuit 200 are always within a predetermined range of voltages that are typical or normal for such FETs, electric fields across the junctions in each FET and the stress applied to the gate oxide of each FET are minimized. Thus, the utilization of intermediate voltages $V_{M1}$ and $V_{M2}$ facilitates full voltage protection of FETs 202, 204, 205, 208, 210, 212 and 214 during erase cycles when an erase voltage greater than 15 volts, e.g. 20 volts, is applied to the source 46 of memory cell 42. The bias voltages of all FETs utilized in circuit 200 are maintained within a predetermined range of typical or normal voltages that minimize or reduce the electric fields discussed above and prevent significant stress to the gate-oxide.

Thus, the discharge circuit of the present invention provides full voltage protection of all. FETs during the erase cycle by biasing all FET devices to effect predetermined $V_{gs}$ voltages that are within a predetermined range of normal or typical voltage levels that do not degrade the FET devices. Thus, the electric fields caused by hot electron tunneling or gate-oxide stress are minimized thereby significantly improving the reliability of the flash EEPROM.

Furthermore, the present invention provides a discharge circuit that is relatively less complex in design and thus relatively less expensive to manufacture. No additional stress-tolerant devices are required to facilitate the construction of the discharge circuit of the present invention and therefore, modifications to the fabrication processes are not necessary.

The discharge circuit of the present invention can be used with a very large variety of semiconductor memories, i.e. memories that employ a variety of program/erase mechanisms. Furthermore, the simplicity of the design of the specific embodiments of the discharge circuit of the present invention permit the circuits to be used with current and future designs of semiconductor memories.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A discharge circuit for a cell of a semiconductor memory, the cell including a control gate, a floating gate, a source and a drain, said discharge circuit comprising:

a circuit connected between the source of the cell and ground potential, said circuit having an input for receiving a control signal having first and second states, said circuit coupling the source of the cell to ground potential when the control signal has the first state and substantially isolating the source from ground potential when the control signal has the second state, the source of the cell having an erase voltage applied thereto when the control signal has the second state, said circuit comprising:

a first subcircuit for defining a discharge path between the source of the cell and ground potential and comprising a plurality of transistors connected in series, each transistor having a gate, a source and a drain, and a second subcircuit for effecting predetermined gate-to-source, and drain-to-source voltages of the transistors of said first subcircuit when the control signal has the second state, the predetermined gate-to-source, and drain-to-source voltages of each transistor being less than the erase voltage.

2. The apparatus of claim 1 wherein said first subcircuit comprises:

a first transistor having a gate, source and drain, said gate being coupled to the control signal, said source being coupled to ground potential, wherein when the control signal has the first state, said drain of said first transistor is coupled to said source of said transistor, and when the control signal has the second state, said drain of said first transistor is substantially isolated from said source of said second transistor; and a second transistor having a gate, source and drain, said gate of said second transistor being coupled to a power supply voltage such that a constant conductive path exists between said drain and said source of said second transistor, said source of said second transistor being coupled to said drain of said first transistor to define a first node, said drain of said second transistor being coupled to the source of the cell of the semiconductor memory.

3. The apparatus of claim 2 wherein said second subcircuit comprises a third transistor having a gate, source and drain, said gate of said third transistor being coupled to the control signal, said drain of said third transistor being coupled to said first node, said source of said third transistor being coupled to the power supply voltage, wherein when the control signal has the first state, said source of said third transistor is substantially isolated from said drain of said third transistor, and when the control signal has the second state, a conductive path is created between said source of said third transistor and said drain of said third transistor.

4. The apparatus of claim 3 wherein said apparatus further comprises a network having a first output for providing a first intermediate voltage having a magnitude that is substantially less than a magnitude of the erase voltage.

5. The apparatus of claim 4 wherein said first subcircuit further comprises a fourth transistor coupled between said drain of said second transistor and the source of the memory cell, said fourth transistor having a gate coupled to the supply voltage and said network output such that a constant conductive path exists between said drain and source of said fourth transistor, a source coupled to the drain of said second transistor to define a second node, and a drain coupled to the source of the memory cell, and said second subcircuit further comprises a fifth transistor having a gate coupled to the control signal, a source coupled to said network output and a drain coupled to said second node, said drain and source of said fifth transistor being substantially isolated from one another when said control signal has the first state.

6. The apparatus of claim 5 wherein said network comprises a resistive network having a first port coupled to the source of said cell of the semiconductor memory and a second port coupled to ground potential, said resistive network defining a first network node that provides said first intermediate voltage.

7. The apparatus of claim 5 wherein said network comprises a charge pump circuit having a first output for providing the erase voltage and a second output for providing said first intermediate voltage.

8. The apparatus of claim 5 wherein said first subcircuit further comprises a diode connected between said gate of said fourth transistor and a power supply voltage, said diode having an anode coupled to the power supply voltage and a cathode coupled to said gate of said fourth transistor.

9. The apparatus of claim 4 wherein said first subcircuit further comprises a fourth transistor coupled between said drain of said second transistor and the source of the memory cell, said fourth transistor having a gate coupled to the supply voltage and said network output such that a constant conductive path exists between said drain and source of said fourth transistor, a source coupled to the drain of said second transistor to define a second node, and a drain coupled to the source of the memory cell, and said second subcircuit further comprises a fifth transistor having a gate coupled to the supply voltage, a source coupled to said network output and a drain coupled to said second node, said drain and source of said fifth transistor being substantially isolated from one another when said control signal has the first state.

10. The apparatus of claim 9 wherein said network further comprises additional circuitry for providing a second intermediate voltage having a magnitude that is substantially less than the magnitude of said first intermediate voltage when the erase voltage is applied to the source of the memory cell and the control signal has the second state.

11. The apparatus of claim 10 wherein said first subcircuit further comprises a sixth transistor coupled between said drain of said fourth transistor and the source of the memory cell, said sixth transistor having a gate coupled to the supply voltage and said second output of said network such that a constant conductive path exists between said drain and source of said sixth transistor, a source coupled to the drain of said fourth transistor to define a third node, and a drain coupled to the source of the memory cell, and said second subcircuit further comprises a seventh transistor having a gate coupled to the control signal, a source coupled to said second output of said network and a drain coupled to said third node, said drain and source of said seventh transistor being substantially isolated from one another when said control signal has the first state.

12. The apparatus of claim 11 wherein said first subcircuit further comprises a diode connected between said gate of said sixth transistor and the power supply voltage, said diode having an anode coupled to the power supply voltage and a cathode coupled to said gate of said sixth transistor.

13. The apparatus of claim 11 wherein said network comprises a resistive network having a first port coupled to the source of cell of the semiconductor memory and a second port coupled to ground potential, said resistive network defining a first network node and a second network node that provide said first intermediate voltage and said second intermediate node, respectively.

14. The apparatus of claim 11 wherein said network comprises a charge pump circuit having an output for providing the erase voltage, and additional outputs for providing said first and second intermediate voltages.

15. The apparatus of claim 1 wherein said transistors of said first subcircuit are n-channel FETs, and said transistors of said second subcircuit are p-channel FETs.

* * * * *